(12) United States Patent
Ventola et al.

(10) Patent No.: US 11,112,437 B2
(45) Date of Patent: Sep. 7, 2021

(54) INERTIA CHARACTERISTIC

(71) Applicant: Reactive Technologies Limited, Oxford (GB)

(72) Inventors: Mika Ventola, Oulu (FI); Timo Peltola, Lohja (FI)

(73) Assignee: Reactive Technologies Limited, Oxford (GB)

( * ) Notice: Subject to any disclaimer, the term of this patent is extended or adjusted under 35 U.S.C. 154(b) by 166 days.

(21) Appl. No.: 16/433,258

(22) Filed: Jun. 6, 2019

(65) Prior Publication Data

US 2019/0285671 A1 Sep. 19, 2019

Related U.S. Application Data

(63) Continuation of application No. PCT/EP2017/080561, filed on Nov. 27, 2017.

(30) Foreign Application Priority Data

Dec. 7, 2016 (GB) .................................... 1620814

(51) Int. Cl.
*G01R 21/133* (2006.01)
*G01R 19/25* (2006.01)
(Continued)

(52) U.S. Cl.
CPC ....... *G01R 21/133* (2013.01); *G01R 19/2513* (2013.01); *G01R 23/00* (2013.01);
(Continued)

(58) Field of Classification Search
None
See application file for complete search history.

(56) References Cited

U.S. PATENT DOCUMENTS 8,067,932 B2 * 11/2011 Teodorescu ........ G01R 19/2513
324/76.78
9,441,610 B1 9/2016 Bachmann et al.
(Continued)

FOREIGN PATENT DOCUMENTS

CN 103762618 B 1/2016
CN 103718410 B 10/2016
(Continued)

OTHER PUBLICATIONS

Zografos, Dimitrios, "Estimation of Power System Inertia", Power and Energy Society General Meeting (PESGM), Jul. 17-21, 2016.
(Continued)

*Primary Examiner* — Roy Y Yi
(74) *Attorney, Agent, or Firm* — EIP US LLP

(57) ABSTRACT

Apparatus and methods for determining an inertia characteristic of a synchronous area of an electric power grid are described. First data is determined. The first data represents a signal comprising a first variation in the grid frequency over a period of time, the signal resulting from a second variation, the second variation being a variation in provision of electric power to and/or consumption of electric power from the grid, the signal having been filtered according to a first filter defining a first frequency band to at least attenuate frequencies outside of the first frequency band. Second data is determined. The second data is representative of the second variation on a second frequency band, the second frequency band being substantially the same as the first frequency band. An inertia characteristic of a synchronous area of the electric power grid is determined based on the first data and the second data.

21 Claims, 7 Drawing Sheets

(51) Int. Cl.
*G01R 23/00* (2006.01)
*H02J 3/14* (2006.01)
*H02J 3/38* (2006.01)
*H02J 3/24* (2006.01)

(52) U.S. Cl.
CPC .................. *H02J 3/14* (2013.01); *H02J 3/24* (2013.01); *H02J 3/383* (2013.01); *H02J 3/386* (2013.01); *Y02B 70/3225* (2013.01); *Y02E 10/56* (2013.01); *Y02E 10/76* (2013.01); *Y04S 20/222* (2013.01)

(56) References Cited

U.S. PATENT DOCUMENTS

2011/0305050 A1   12/2011   Krein et al.
2012/0310426 A1   12/2012   Tarnowski
2015/0207528 A1   7/2015    Chassin
2016/0248254 A1   8/2016    Huomo et al.

FOREIGN PATENT DOCUMENTS

| CN | 106026196 A | 10/2016 | |
|---|---|---|---|
| JP | 5747504 B2 | 7/2015 | |
| TW | 201340534 A | 10/2013 | |
| WO | WO-2015067602 A2 * | 5/2015 | ......... G01R 19/2513 |

OTHER PUBLICATIONS

United Kingdom Combined Search and Examination Report dated Jun. 7, 2017 for Application No. GB 1620814.2.
International Search Report and Written Opinion dated Apr. 3, 2018 for PCT Application No. PCT/EP2017/080561.
Office Action dated Mar. 24, 2021 for Taiwanese Patent Application No. 106142890.

* cited by examiner

INERTIA CHARACTERISTIC

CROSS-REFERENCE TO RELATED APPLICATIONS

This application is a continuation of International Application No. PCT/EP2017/080561, filed Nov. 27, 2017, which claims priority to UK Application No. GB1620814.2, filed Dec. 7, 2016, under 35 U.S.C. § 119(a). Each of the above-referenced patent applications is incorporated by reference in its entirety.

BACKGROUND OF THE INVENTION

Field of the Invention

The present invention relates to an apparatus and method for determining an inertia characteristic of a synchronous area of an electric power grid.

Description of the Related Technology

Generated electrical power is distributed to consumers via an electricity distribution network or electric power grid. Electric power grids typically operate at a nominal grid frequency that is uniform throughout a synchronous area of the grid. For example, the UK mains supply nominally operates at 50 Hz. Grid operators are usually obliged to maintain the grid frequency to within predefined limits, for example the UK mains supply should be kept within 0.4% of the nominal 50 Hz grid frequency.

Large capacity power stations, such as nuclear or fossil fuel power stations, use spinning generators having relatively massive rotating parts that are powered to rotate at relatively high speeds at some multiple of the nominal grid frequency (so called spinning generation). In the course of their normal operation, these spinning generators store relatively large amounts of kinetic energy. Small capacity providers, such as wind or solar farms use inverters to supply power to the grid at the nominal grid frequency, and typically store a much smaller amount of kinetic energy, or even no kinetic energy at all.

A change in the balance between provision and consumption of electrical power to the grid (for example, if the total amount of provision cannot meet consumption during high demand periods, or if the provision from a power generator or interconnect fails) leads to a change in the load on the generators. This results in a change of the rotational speed of the spinning generators and a corresponding change in the operating frequency of the grid. Grid operators therefore use the grid operating frequency as a measure of the balance between provision and consumption of electrical power in the grid.

Grid inertia is a measure of the amount of kinetic energy stored in the electric power grid and influences the rate at which the operating frequency of the grid changes in response to a change in balance of power provision and consumption in the grid. The grid inertia depends on the number and type of both generators and loads connected to the grid. For example, spinning generation such as in nuclear or fossil fuel power stations generally contribute to the grid inertia whereas renewable energy production methods like wind and solar generally do not. Additionally, large rotating power consumption machines such as used in factories generally contribute to inertia whereas typical domestic consumption, such as loading laptop batteries, generally does not. Due to the different mix of generators and loads in different areas of the electrical power grid, different areas of the electrical power grid can have different inertia values. The rate of change of grid frequency for a given change in power balance in a grid area with high inertia is less than it is in a grid area with low inertia.

Since inertia indicates how a grid responds to sudden changes in consumption or generation, an accurate estimate of grid inertia, or an inertia characteristic indicative of grid inertia, can be useful for grid operators in tailoring strategies for mitigating the effects of such sudden changes, for example.

SUMMARY

According to a first aspect of the present invention, there is provided apparatus for determining an inertia characteristic of a synchronous area of an electric power grid, electricity flowing in the grid in accordance with a grid frequency, wherein the apparatus is arranged to:

determine first data representing a signal comprising a first variation, the first variation being a variation in the grid frequency over a period of time, the signal resulting from a second variation, the second variation being a variation in provision of electric power to and/or consumption of electric power from the grid, the signal having been filtered according to a first filter defining a first frequency band to at least attenuate frequencies outside of the first frequency band;

determine second data representative of the second variation on a second frequency band, the second frequency band being substantially the same as the first frequency band; and determine an inertia characteristic of a synchronous area of the electric power grid based on the first data and the second data.

According to a second aspect of the present invention, there is provided a computer program comprising instructions which, when executed by a computer, causes the computer at least to perform:

determining first data representing a signal comprising a first variation, the first variation being a variation in the grid frequency over a period of time, the signal resulting from a second variation, the second variation being a variation in provision of electric power to and/or consumption of electric power from the grid, the signal having been filtered according to a first filter defining a first frequency band to at least attenuate frequencies outside of the first frequency band;

determining second data representative of the second variation on a second frequency band, the second frequency band being substantially the same as the first frequency band; and determining an inertia characteristic of the electric power grid based on the first data and the second data.

According to a third aspect of the present invention, there is provided a method of determining an inertia characteristic of a synchronous area of an electric power grid, electricity flowing in the grid in accordance with a grid frequency, the method comprising:

determining first data representing a signal comprising a first variation, the first variation being a variation in the grid frequency over a period of time, the signal resulting from a second variation, the second variation being a variation in provision of electric power to and/or consumption of electric power from the grid, the signal having been filtered according to a first filter defining a first frequency band to at least attenuate frequencies outside of the first frequency band;

determining second data representative of the second variation on a second frequency band, the second frequency band being substantially the same as the first frequency band; and determining an inertia characteristic of the electric power grid based on the first data and the second data.

According to a fourth aspect of the present invention, there is provided a method of determining a local inertia parameter representative of an inertia of a local area of a synchronous area of an electric power grid, electricity flowing in the grid in accordance with a grid frequency, the method comprising:

determining first data representing a signal comprising a first variation, the first variation being a variation in the grid frequency over a period of time, the signal resulting from a second variation, the second variation being a variation in provision of electric power to and/or consumption of electric power from the grid;

determining second data representative of the second variation;

determining, based on the first data and on the second data, a plurality of first inertia characteristics for each of a respective different variation frequency; and fitting a function to the plurality of first inertia characteristics, the function being parameterised at least by a local inertia parameter, thereby to derive the local inertia parameter.

According to a fifth aspect of the present invention, there is provided a method of determining a local inertia value representative of an inertia of a local area of a synchronous area of an electric power grid, electricity flowing in the grid in accordance with a grid frequency, the method comprising:

determining first data representing a signal in a first area of the electric power grid, the signal comprising a first variation, the first variation being a variation in the grid frequency over a period of time, the signal resulting from a second variation, the second variation being a variation in provision of electric power to and/or consumption of electric power from the grid;

determining second data relating to the second variation;

determining, based on the first data, and the second data, a local inertia value relating to the first area using a function parameterised by at least a parameter relating to power flow between the first area and a second area of the electric power grid.

Further features and advantages of the invention will become apparent from the following description of preferred embodiments of the invention, given by way of example only, which is made with reference to the accompanying drawings.

BRIEF DESCRIPTION OF THE DRAWINGS

FIG. 2b illustrates schematically an exemplary plot of grid frequency f as a function of time t over the same time period as in FIG. 2a;

DETAILED DESCRIPTION OF CERTAIN INVENTIVE EMBODIMENTS

Figure 1:
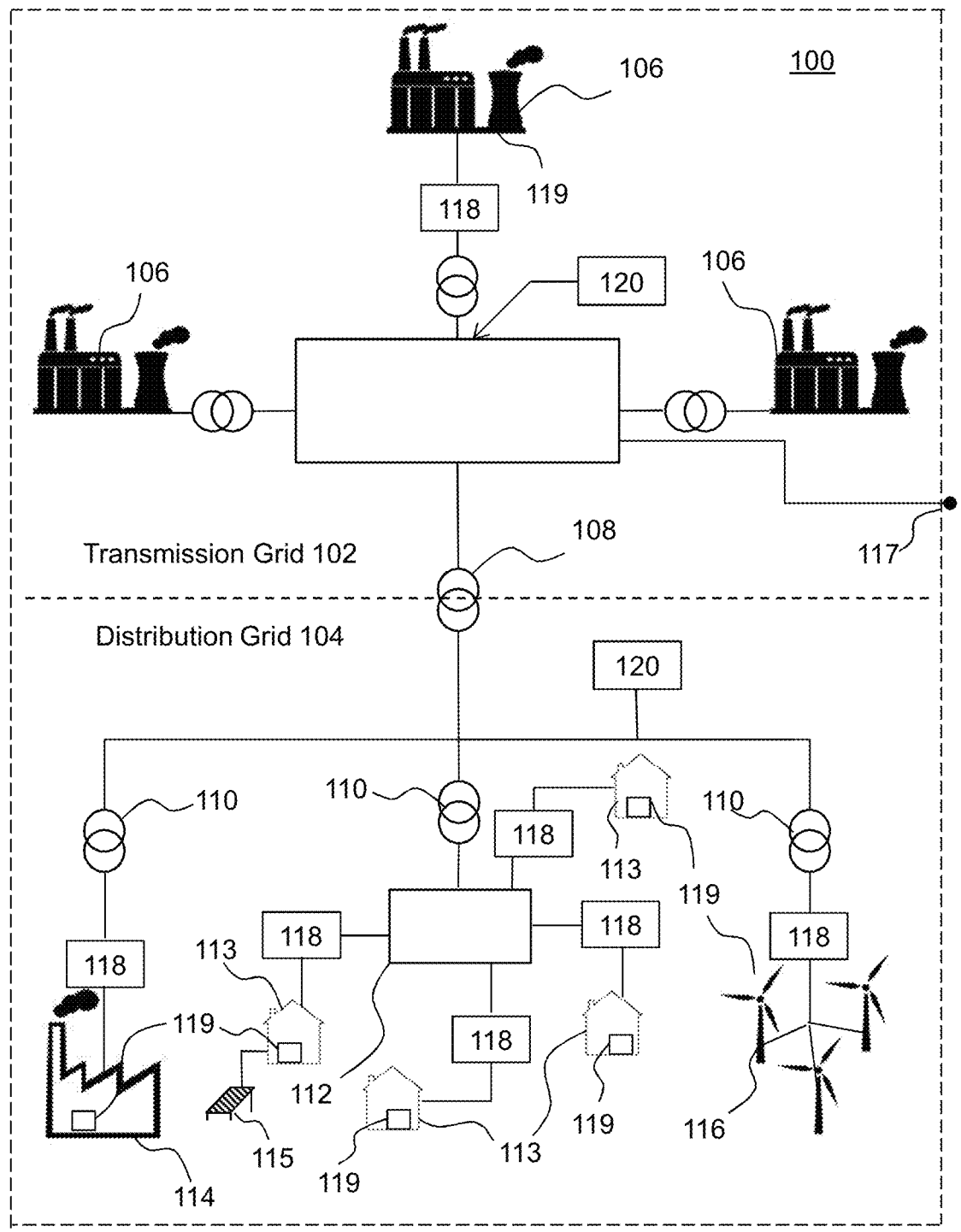
FIG. 1 illustrates schematically an exemplary electric power grid.

Supply of electricity from providers such as power stations, to consumers, such as domestic households and businesses, typically takes place via an electricity distribution network or electric power grid. FIG. 1 shows an exemplary electric power grid 100 comprising a transmission grid 102 and a distribution grid 104.

The transmission grid 102 is connected to power generators 106, which may be nuclear plants or gas-fired plants, for example, from which it transmits large quantities of electrical energy at very high voltages (typically of the order of hundreds of kV), over power lines such as overhead power lines, to the distribution grid 104.

The transmission grid 102 is linked to the distribution grid 104 via a transformer 108, which converts the electric supply to a lower voltage (typically of the order of 50 kV) for distribution in the distribution grid 104.

The distribution grid 104 is connected via substations 110 comprising further transformers for converting to still lower voltages to local networks which provide electric power to power consuming devices connected to the electric power grid 100. The local networks may include networks of domestic consumers, such as a city network 112, that supplies power to domestic appliances within private residences 113 that draw a relatively small amount of power in the order of a few kW. Private residences 113 may also use photovoltaic devices 115 to provide relatively small amounts of power for consumption either by appliances at the residence or for provision of power to the grid. The local networks may also include industrial premises such as a factory 114, in which larger appliances operating in the industrial premises draw larger amounts of power in the order of several kW to MW. The local networks may also include networks of smaller power generators such as wind farms 116 that provide power to the electric power grid.

The electric power grid 100 may comprise one or more measurement devices 120 for measuring the grid frequency, and/or one or more power modulation devices 118 for modulating provision and/or consumption of electric power to and/or from the electric power grid 100. One or more of the power modulation devices 118 may be a grid battery or a domestic battery, for example. Each modulation device 118 may be associated with a power unit 119 (which may consume power from and/or provide power to the electric power grid 100) or a group of power units 119 and is arranged to modulate power flow to and/or from the power unit 119 or group of power units 119.

Although, for conciseness, only one transmission grid 102 and one distribution grid 104 are shown in FIG. 1, in practice a typical transmission grid 102 supplies power to multiple distribution grids 104 and one transmission grid 102 may also be interconnected to one or more other transmission grids 102.

Electric power flows in the electric power grid 100 as alternating current (AC), which flows at a system frequency, which may be referred to as a grid frequency (typically 50 or 60 Hz, depending on country). The electric power grid 100 operates at a synchronized frequency so that the frequency is substantially the same at each point of the grid.

The electric power grid 100 may include one or more direct current (DC) interconnects 117 that provide a DC connection between the electric power grid 100 and other electric power grids. Typically, the DC interconnects 117 connect to the typically high voltage transmission grid 102 of the electrical power grid 100. The DC interconnects 117 provide a DC link between the various electric power grids, such that the electric power grid 100 defines an area which operates at a given, synchronised, grid frequency that is not affected by changes in the grid frequency of other electric power grids. For example, the UK transmission grid is connected to the Synchronous Grid of Continental Europe via DC interconnects.

The electric power grid 100 has a grid inertia, which is a measure of the amount of kinetic energy stored in the electric power grid 100 and influences the rate at which the grid frequency changes in response to a change in balance of power provision and consumption in the grid 100. Different areas of the electric power grid 100 may have different mixes of types of generation and consumption, and hence may have different local inertia values.

Figure 2A:
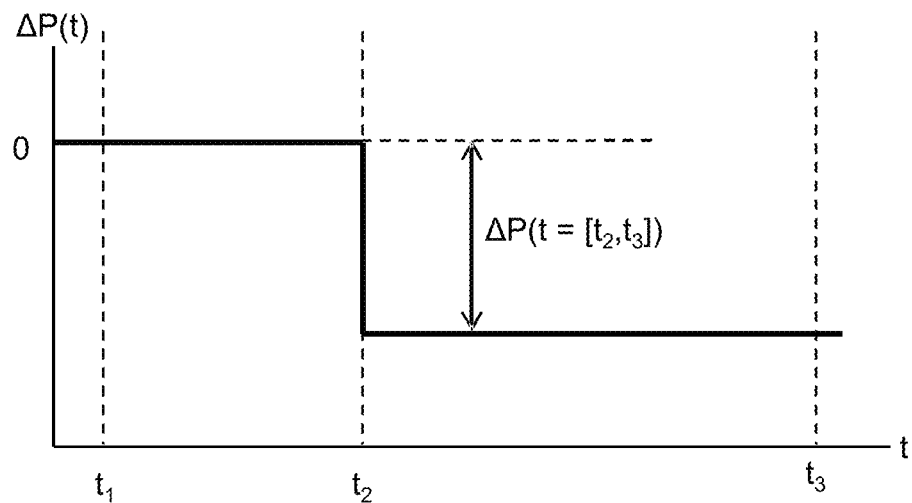
FIG. 2a illustrates schematically an exemplary plot of power balance ΔP as a function of time t.
Figure 2B:
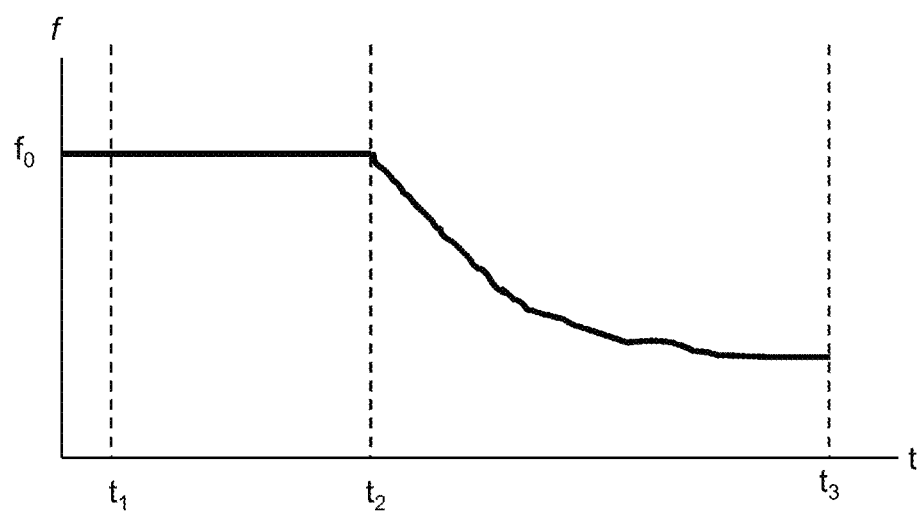

FIG. 2a illustrates schematically a hypothetical plot of the balance of provision and consumption of electric power $\Delta P(t)$ to the electric power grid 100 over a period of time $t_1$ to $t_3$. FIG. 2b illustrates schematically a hypothetical plot of the grid frequency f of the grid 100 between times $t_1$ to $t_3$ in response to the power balance change illustrated in FIG. 2a.

Referring to FIGS. 2a and 2b, between $t_1$ and $t_2$, the electric power provided to the grid 100 is equal to the electric power consumed from the grid 100, and hence $\Delta P(t)$ is zero. As a result, the grid frequency f remains constant at the nominal grid frequency $f_0$. However, at $t_2$ $\Delta P$ reduces to $\Delta P(t=[t_2, t_3])$, indicating more electric power is consumed from the grid than is provided. This may be caused, for example, by a decrease in provision, for example due to a failure of the interconnect 117 by an amount $\Delta P$. The change in $\Delta P(t)$ causes a corresponding reduction in the grid frequency f. Between $t_2$ and $t_3$, $\Delta P(t)$ remains constant at its reduced value. As a result, the grid frequency f settles to a new, lower, value, where it may remain until the power balance $\Delta P$ changes again.

An estimate of an inertia characteristic H of the electric power grid 100 may be derived from the magnitude of the power balance change $\Delta P(t=[t_2, t_3])$ and the rate of change of frequency $\partial f/\partial t$ using the following equation (also referred to as the swing equation):

$$H = \frac{\Delta P(t = [t_2, t_3]) \cdot f_0}{2 \cdot \frac{\partial f}{\partial t}} \quad (1)$$

where $f_0$ is the nominal grid frequency.

In using the magnitude of the entire power balance change $\Delta P(t=[t_2, t_3])$, equation (1) assumes that the change in the balance of provision and consumption of electric power to the electric power grid 100 occurs instantaneously and infinitely fast, that is, the power balance change $\Delta P(t)$ is a step function.

However, the estimate of the inertia characteristic H using equation (1) may be inaccurate. This is because a step function comprises a Fourier series of oscillatory sine wave signals at different frequencies ω. Indeed an ideal step function (that is one involving instantaneous change, as is assumed in equation (1)) comprises an infinite series of such sine wave signals, the highest frequency component of which has infinite frequency ω. In assuming the power balance change is a step function therefore, equation (1) also relies on the assumption that the signal comprising the variation in grid frequency f used in calculating the rate of change of frequency $\partial f/\partial t$ comprises a corresponding infinite number of frequencies ω. However, the inventors have appreciated that, in practice, the signal comprising the variation in grid frequency f used in calculating the rate of change of frequency $\partial f/\partial t$ may not include an infinite number of frequencies ω.

For example, in practice, a measurement of the grid frequency f involves sampling the alternating voltage (or current) at a point in the grid 100 over a period of time, for example using a measurement device 120 such as a Phasor Measurement Unit (PMU). In practice, measurement devices 120 have a limited sampling frequency, and hence the highest frequency ω observable in the measured grid frequency signal is also limited. For example, if a measurement device 120 samples the grid frequency f at 50 samples per second, then due to the Nyquist sampling theorem, the maximum variation frequency ω in grid frequency f observable by the measurement device is 25 Hz. In this example, the measurement device 120 therefore in effect applies a low pass filter that removes variation frequencies ω above 25 Hz.

As another example, in practice, noise may be removed from the grid frequency signal in order to facilitate determination of the rate of change of grid frequency $\partial f/\partial t$. This may be achieved for example using a 5 Hz low pass filter which attenuates variation frequencies ω above 5 Hz.

The inventors have appreciated that, in practice therefore, the signal comprising the variation in grid frequency f (also referred to herein as the grid frequency signal) used in calculating the rate of change of frequency $\partial f/\partial t$ does not include all variation frequencies ω in grid frequency f, and hence is not an accurate representation of the variation in grid frequency f due to the total change in power balance $\Delta P$. In other words, the grid frequency signal actually observed is due only to a proportion of the power balance change, rather than the total power balance change $\Delta P$ as used in equation (1).

The inventors have appreciated that, in order to obtain an accurate inertia characteristic H, the power balance change used in equation (1) should be the proportion of the power balance change on a frequency band $[\omega_{p1}, \omega_{p2}]$ substantially the same as the frequency band $[\omega_{f1}, \omega_{f2}]$ of the grid frequency signal f used. In other words, equation the swing equation (1) may be reformulated as:

$$H = \frac{\Delta P(t)[\omega_{p1}, \omega_{p2}] \cdot f_0}{2 \cdot \frac{\partial f[\omega_{f1}, \omega_{f2}]}{\partial t}} \quad (2)$$

where $\omega_{p1}$ and $\omega_{p2}$ are the endpoints of the power balance change frequency band, and $\omega_{f1}$ and $\omega_{f2}$ are the endpoints of the grid frequency signal frequency band.

It will be appreciated that the most accurate value of inertia characteristic H may be obtained by setting $[\omega_{p1}, \omega_{p2}]$ equal to $[\omega_{f1}, \omega_{f2}]$, but that these frequency bands need not be exactly equal in order to nevertheless obtain an improvement in the accuracy of the determined inertia characteristic H.

Figure 3:
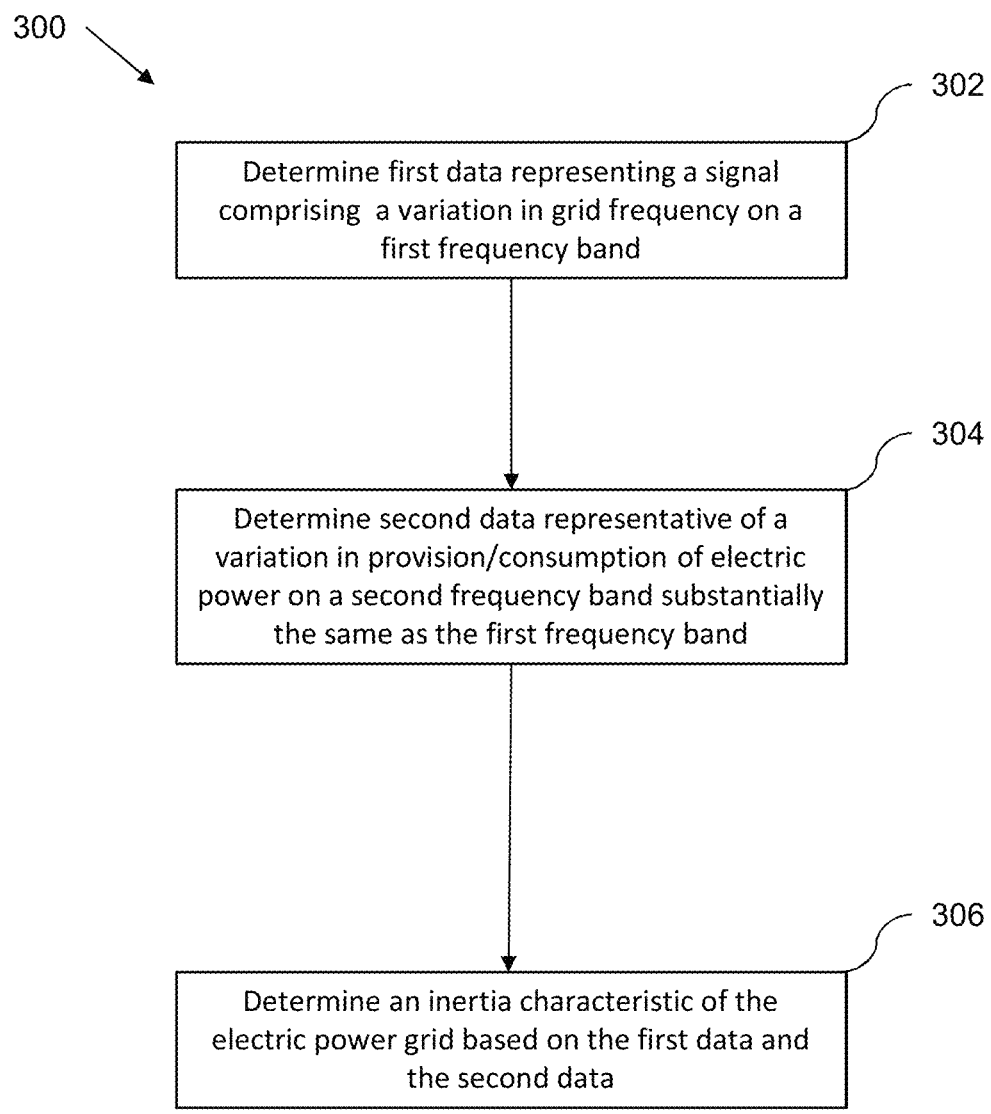
FIG. 3 is a flow diagram illustrating an exemplary method of determining an inertia characteristic.

FIG. 3 illustrates schematically a flow diagram 300 representing a method for determining an inertia characteristic H of a synchronous area of an electric power grid 100, electricity flowing in the grid in accordance with a grid frequency f, according to an example embodiment of the present invention.

The method comprises, at step 302, determining first data. The first data represents a signal comprising a first variation in the grid frequency f over a period of time. For example, the first data may be values representing grid frequency signal at a number of sample points taken over a period of time, for example, between $t_2$ and $t_3$ in FIG. 2b. The signal comprising the first variation results from a second variation in provision of electric power to and/or consumption of electric power from the grid 100. For example, the variation in grid frequency f from $t_2$ in FIG. 2b may result from the power balance change at $t_2$ in FIG. 2a. The grid frequency signal that the first data represents has been filtered according to a first filter defining a first frequency band $[\omega_{f1}, \omega_{f2}]$ to at least attenuate frequencies $\omega$ outside of the first frequency band $[\omega_{f1}, \omega_{f2}]$. For example, the first filter may be a low pass filter applied to the grid frequency signal by the measurement device 120 due to the limited sampling rate (e.g. 50 samples per second) of the measurement device 120. In this case, the frequency band $[\omega_{p1}, \omega_{p2}]$ defined by the first filter may be, for example, [0, 25] Hz (i.e. 0-25 Hz), where frequencies outside of this band are at least attenuated. It is to be understood that, while the term "attenuate" (i.e. reduce by some degree) is used herein, in some embodiments the frequencies may instead be removed (i.e. eliminate entirely). Accordingly, the term "at least attenuate" as used herein includes "attenuate" and "remove".

The method comprises, at step 304, determining second data. The second data is representative of the second variation (i.e. the variation in provision of electric power to and/or consumption of electric power from the grid 100) on a second frequency band $[\omega_{p1}, \omega_{p2}]$ substantially the same as the first frequency band $[\omega_{f1}, \omega_{f2}]$. For example, the second data may be values representing the power balance change as illustrated in FIG. 2a on the frequency band 0-25 Hz. For example, if a UK-France interconnector of 1000 MW trips, the power balance $\Delta P$ resulting from this event as a function of time may be represented by a step function as: $\Delta P(t=t_1 \ldots t_N)=[0, 0, 0, \ldots, 0, -1000, -1000, -1000, \ldots]$. The power balance $\Delta P$ on the second frequency band as a function of time may then be represented as: $\Delta P(t=t_1 \ldots t_N)[\omega_{p1}, \omega_{p2}]=[0, 0, 0, \ldots, 0, -600, -900, -1000, \ldots]$, for example.

The method comprises, at step 306, determining an inertia characteristic H of the electric power grid 100 based on the first data and the second data. For example, the inertia characteristic H may be determined directly using equation (2). This may be achieved in a number of different ways.

In a first example, a rate of change of grid frequency on the first frequency band $\partial f[\omega_{f1}, \omega_{f2}]/\partial t_n$ for a sample point n is calculated by taking the difference in grid frequency from the sample point n to a subsequent sample point n+1, as represented by the first data, and dividing this difference by the time period between sample points n and n+1. This is repeated for each n=[0, . . . N−1], where N is the total number of the array of samples. An average is then taken over the determined rates of change of grid frequency on the first frequency band $\partial f[\omega_{f1}, \omega_{f2}]/\partial t_n$ for each sample point n, i.e. over the total number of the array of samples N. Alternatively, the average may be taken over a sub-set or minimum number of the determined rates of change of grid frequency on the first frequency band $\partial f[\omega_{f1}, \omega_{f2}]/\partial \partial_n$. For example, the subset may include two sample points, for example. In either case, the determined average may then be used as the rate of change of grid frequency on the first frequency band $\partial f[\omega_{f1}, \omega_{f2}]/\partial t$ in equation (2). Similarly, the power balance change on the second frequency band $\Delta P(t)[\omega_{p1}, \omega_{p2}]$ of equation (2) is calculated by taking an average of the differences between the power balance on the second frequency band at consecutive sample points n and n+1 for each n=[0 . . . N−1], or the subset of those sample points, as represented by the second data. The calculated rate of change of grid frequency on the first frequency band $\partial f[\omega_{f1}, \omega_{f2}]/\partial t$ and the calculated power balance change on the second frequency band $\Delta P(t)[\omega_{p1}, \omega_{p2}]$ are then substituted into equation (2), along with the nominal grid frequency $f_0$ (e.g. 50 Hz for the UK), and an inertia characteristic H accordingly determined.

In a second example, a rate of change of grid frequency on the first frequency band $\partial f[\omega_{f1}, \omega_{f2}]/\partial t$ for a sample point n is calculated by taking the difference in grid frequency from the sample point n to a subsequent sample point n+1, as represented by the first data, and dividing this difference by the time period between sample points n and n+1. Similarly, a change in power balance on the second frequency band $\Delta P(t)[\omega_{p1}, \omega_{p2}]$ for the sample point n is calculated by taking the difference in power balance from the sample point n to the subsequent sample point n+1, as represented by the second data. These values are substituted into equation (2) to return an inertia characteristic $H_n$ for the particular time period between sample points n and n+1. This procedure may then be repeated for a set of sample points running over the desired time period, for example over each of n=[0 . . . N−1], or a subset of those sample points, thereby to produce a corresponding set of inertia characteristics $H_n$ each for respective time periods between a sample point n and a sample subsequent point n+1. The inertia characteristic H may then be determined by taking an average over the determined set of inertia characteristics $H_n$. The average may be, for example, the mean or the median, and/or may be a weighted average.

Determining the inertia characteristic H based on second data representative of the second variation on a second frequency band $[\omega_{p1}, \omega_{p2}]$ substantially the same as the first frequency band $[\omega_{f1}, \omega_{f2}]$, allows the power balance change actually contributing to the observed frequency response to be taken into account in the determination of the inertia characteristic H, and hence allows for a more accurate inertia characteristic H to be determined.

The above described method may be implemented in various different ways.

For example, the method may comprise determining the first data by extracting the first data from a log of data, for example from a data store storing historical data of measured grid frequency f. This data store may be, for example, a data store of the measurement device 120, or of an apparatus comprising a measurement device 120 (such as apparatus 600 described below with reference to FIG. 7) or a data store of a remote server (not shown), for example. In this case, since the grid frequency f will have been measured using a measurement device of finite bandwidth, the first data is already representative of a signal that has been filtered according to a first filter. Filtering may be applied to the extracted data, for example, a low pass filter having a 3 dB cut off at 5 Hz, to remove noise, as described above.

In other examples, the method may comprise measuring the signal comprising the first variation, for example using measurement device 120. In this case, the first data may be determined substantially in real time directly from the measurement of the grid frequency signal. In this case, the method may comprise applying, to the signal, the first filter defining the first frequency band.

In some examples, the method may comprise applying to the signal a plurality of filters each defining a respective band to at least attenuate frequencies outside of the respective band. In this case the first filter is representative of the combination of the plurality of filters. It will be appreciated that in this case, in order that the second frequency band $[\omega_{p1}, \omega_{p2}]$ remains substantially the same as the first frequency band $[\omega_{f1}, \omega_{f2}]$, a similar second filter or filters may be applied to the power balance change.

For example, a low pass filter may be applied to attenuate noise from the grid frequency signal. This may assist in determining an accurate rate of change of grid frequency $\partial f/\partial t$ resulting from influences apart from noise. This may be achieved for example by applying a 5 Hz low pass filter which attenuates variation frequencies $\omega$ above 5 Hz.

As another example, a low pass filter may be applied to attenuate high variation frequency components in order to obtain a more accurate determination of the total inertia characteristic $H_{tot}$ associated with the total synchronous area of the electric power grid 100. This is because lower frequency components of the power balance change propagate more evenly through the electric power grid than higher frequency components. Attenuating the high frequency components therefore attenuates local influences, such as the particular mix of generation at the particular location of the measurement of grid frequency f from the inertia characteristic H calculation, and hence provides a more accurate determination of the total inertia characteristic $H_{tot}$. This may be achieved for example applying a 1 Hz low pass filter which attenuates variation frequencies $\omega$ above 1 Hz.

As another example, a high pass filter may be applied to attenuate low variation frequency components. Such a filter may be applied in order to obtain a more accurate determination of the inertia characteristic H because particularly low variation frequencies may not be particularly representative of the change in grid frequency due to the power balance change. Such a high pass filter may alternatively or additionally be applied in order to attenuate very low variation frequencies (e.g. around and below 0.1 Hz) that would otherwise distort a Fourier Transform of the grid frequency or power balance change, which as described below may be useful for determining an inertia characteristic. This may be achieved for example applying a 0.1 Hz high pass filter which attenuates variation frequencies $\omega$ below 0.1 Hz. A high pass or a band pass filter may be applied to remove a mean value (i.e. DC offset, DC component, DC bias, DC coefficient) of the grid frequency signal and/or the power balance change.

It will be appreciated that in cases where both a high pass filter and a low pass filter are applied to the grid frequency signal and/or the power balance change, their combination may effect a band-pass filter, or alternatively, a band-pass filter may be used in their place. For example, a band-pass filter at 0.5 Hz-1.0 Hz may be used that attenuates variation frequencies below 0.5 Hz and variation frequencies above 1.0 Hz. Indeed, it will be appreciated that the first filter may have any filter profile, for example defining one or more pass-bands and/or one or more stop-bands, including attenuation and/or amplification, as required. Moreover, it will be appreciated that the grid frequency signal may be determined on one or more frequency bands sequentially or simultaneously.

In some examples, the second data may be determined by extracting the second data from a log, for example from a data store storing historical data of power balance change on the second frequency band $[\omega_{p1}, \omega_{p2}]$. In other examples, the second variation on the second frequency band $[\omega_{p1}, \omega_{p2}]$ may be inferred or reconstructed from a known power balance change, or measured directly from one or more power units 119 providing and/or consuming electric power from the electric power grid.

In some examples, as mentioned above, the second data may be determined by applying a second filter defining the second frequency band $[\omega_{p1}, \omega_{p2}]$ to the second variation to at least attenuate frequencies outside of the second frequency band $[\omega_{p1}, \omega_{p2}]$. The second variation to which the second filter may be applied may be, for example, extracted from a data store storing historical data of power balance change, or inferred or reconstructed from a known power balance change, or measured directly from one or more power units 119 providing and/or consuming electric power from the electric power grid, for example. As for the first filter, the second filter may be representative of a combination of a plurality of filters, and may comprise one or more high-pass, low-pass, and/or band-pass filters and/or one or more filters having any filter profile, including attenuation and/or amplification, as required. Similarly, it will be appreciated that the power balance variation may be determined on one or more frequency bands sequentially or simultaneously.

The first filter and/or the second filter may comprise one and/or both of a digital filter and an analogue filter. For example, an analogue signal may be filtered using an analogue filter such as resistor-capacitor (RC) filter circuit. As another example, an analogue signal may be converted into a digital signal and then be digitally filtered, or a digital signal may be digitally filtered. The digital filter may be applied in the time domain and/or in the frequency domain (see also below).

In some examples, the first frequency band $[\omega_{f1}, \omega_{f2}]$ and the second frequency band $[\omega_{p1}, \omega_{p2}]$ may be pre-set. For example, the sampling rate of a grid frequency measurement device 120 may be pre-set at 50 samples per second, and hence the first frequency band may be pre-set at 0-25 Hz, and accordingly the second frequency band $[\omega_{p1}, \omega_{p2}]$ may be pre-set to be substantially the same, for example, at 0-25 Hz.

In other examples, the first frequency band $[\omega_{f1}, \omega_{f2}]$ and/or the second frequency band $[\omega_{p1}, \omega_{p2}]$ or bands may be modified or set as required. In some examples, the method may comprise determining one of the first frequency band $[\omega_{f1}, \omega_{f2}]$ and the second frequency band $[\omega_{p1}, \omega_{p2}]$, and setting the other of the first frequency band $[\omega_{f1}, \omega_{f2}]$ and the second frequency band $[\omega_{p1}, \omega_{p2}]$ based on the determined one of the first frequency band $[\omega_{f1}, \omega_{f2}]$ and the second frequency band $[\omega_{p1}, \omega_{p2}]$. For example, it may be determined that the first frequency band $[\omega_{f1}, \omega_{f2}]$ is a pass-band at 0.5 Hz to 1.0 Hz. This may be achieved by determining the first filter that has been applied and inferring or determining the first frequency band $[\omega_{f1}, \omega_{f2}]$ that the first filter defines, for example by accessing a look-up table storing filter identifiers in association with frequency bands that the respective filters define. The second frequency band $[\omega_{p1}, \omega_{p2}]$ may then be set based on the determined first frequency band $[\omega_{f1}, \omega_{f2}]$, i.e. set to be substantially the same as the determined first frequency band $[\omega_{f1}, \omega_{f2}]$. For example, the second filter applied to the power balance change may be set or chosen to define the second frequency band $[\omega_{p1}, \omega_{p2}]$ to be substantially the same as the determined first frequency band $[\omega_{f1}, \omega_{f2}]$. It will be appreciated that the above applies equally in cases where the first filter defines a plurality of frequency bands, and/or the power balance variation is determined on a plurality of frequency bands.

In some examples, the method comprises transforming one or both of the first variation and the second variation into a frequency domain. This may be achieved, for example, by applying a Fourier transform to grid frequency signal and/or the power balance change or a portion thereof.

For example, filtering a digital signal on a particular frequency band in the frequency domain may comprise attenuating and/or removing the frequency components outside the desired frequency band. An inverse Fourier transform may then be applied to the signal in the frequency domain to return a representation of the signal in the time domain, but with frequency components outside the desired frequency band attenuated. Accordingly, the first filter and/or the second filter mentioned above may comprise a transform into a frequency domain.

As another example, a Fourier transform may be used to determine the grid frequency variation and/or the power balance variation at one or more specific variation frequencies ω. For example, a Fourier transform is applied to the variation in the time domain to return the variation in the frequency domain. An inverse Fourier transform may then be applied to a specific frequency component with variation frequency ω to return the time domain signal of the corresponding frequency component. This frequency component may then be used in equation (2), but with the frequency bands [$\omega_{f1}$, $\omega_{f2}$] and [$\omega_{p1}$, $\omega_{p2}$] being reduced to a single frequency co. This may particularly suitable, for example, where the power balance variation is periodic, as the frequency components of the power balance change and the grid frequency signal in this case will exist at discrete values of variation frequency ω. It will be appreciated that a frequency band may be a single frequency, for example [$\omega_{f1}$, $\omega_{f2}$]=w when $\omega_{f1}=\omega_{f2}=\omega$.

As another example, as an alternative to solving equation (2) in the time domain, equation (1) may be solved in the frequency domain. For example, taking the Fourier transform of equation (1) returns:

$$H = \frac{\widehat{\Delta P}(\omega) \cdot f_0}{2 \cdot i\omega \hat{f}(\omega)} \quad (3)$$

where i=$\sqrt{-1}$, $\widehat{\Delta P}(\omega)$ is the value of the Fourier transform of the power balance change at variation frequency ω, and $\hat{f}(\omega)$ is the value of the Fourier transform of the grid frequency signal at variation frequency ω.

In this case, determining the first data in step 302 of FIG. 3 may comprise determining $\hat{f}(\omega)$, determining the second data in step 304 of FIG. 3 may comprise determining $\widehat{\Delta P}(\omega)$, and determining the inertia characteristic in step 306 of FIG. 3 may comprise solving equation (3) for H.

It will be appreciated that in the above examples one or more filters may be applied to the power balance change and/or the grid frequency signal before a Fourier transform is taken. For example, it may be particularly useful to apply a high pass filter to attenuate very low frequency components (e.g. around or below 0.1 Hz) that could distort the Fourier transform, or to remove a DC component.

As mentioned above, lower variation frequencies ω propagate more evenly through the grid than higher variation frequencies ω which are more sensitive to local influences. The inventors have appreciated that using higher variation frequencies ω will result in a determination of inertia characteristic $H_k$ more associated with a local area k of the grid, whereas using lower variation frequencies ω will result in a determination inertia characteristic $H_{tot}$ more associated with the total grid.

Accordingly, in order to determine local inertia characteristics $H_k$, the above method may be performed having the first frequency band (and accordingly the second frequency band) at relatively high variation frequencies, for example, at 4-5 Hz. Different local inertia characteristics $H_k$ of different local areas k may then be determined by repeating the method using grid frequency signals measured at different locations k in the grid.

In order to determine a total inertia characteristic $H_{tot}$, the above method may be performed having the first frequency band (and accordingly the second frequency band) at relatively low variation frequencies, for example, at 0.5-1 Hz. In this case, total inertia characteristic $H_{tot}$ measured at one grid location may be the same or similar to that measured in another grid location at the same time.

However, in some specific cases there may be difficulties in determining an inertia characteristic based on power balance variation and grid frequency variation on low frequency bands. For example, when a small load causes the power balance change, the proportion of the power balance change on low frequency bands may be relatively low. This may result in difficulties in detecting the resulting grid frequency signal on low frequency bands above noise. For example, a background power imbalance in the grid typically occurs at such low frequencies, and it may be difficult to detect a variation in grid frequency due to a specific power balance change event above this background. Similarly, for example in cases where the power balance change is periodic, the frequency components of the power balance change and the grid frequency signal may exist at discrete values, at it may be that none of these is at low frequency. Conversely, there may be difficulties in determining an inertia characteristic based on power balance change and grid frequency signal on high frequency bands, for example if the power balance variation does not contain high frequency components, for example.

However, the inventors have appreciated that the grid frequency signal and power balance change need not necessarily be determined on a low frequency band (or high frequency band) in order to determine a total inertia characteristic $H_{tot}$ (or a local inertia characteristic $H_k$). Instead a plurality of first inertia characteristics $H_\omega$ for each of a respective different variation frequency ω may be determined. These first inertia characteristics may then be used to extrapolate a first inertia characteristic $H_\omega$ at a low (high) variation frequency ω, which inertia characteristic will be representative of the total system inertia characteristic $H_{tot}$ associated with the total synchronous area of the electric power grid 100 (local inertia characteristic $H_k$ associated with the local area of the grid 100 in which the grid frequency is measured, for example).

The plurality of first inertia characteristics $H_\omega$ at different variation frequencies ω may be determined, for example, using equation (2) or equation (3) as described above for different variation frequencies ω, and/or different frequency bands [$\omega_{f1}$, $\omega_{f2}$] and [$\omega_{p1}$, $\omega_{p2}$] as appropriate.

The variation frequency ω or frequency band [$\omega_{f1}$, $\omega_{f2}$], [$\omega_{p1}$, $\omega_{p2}$] used may be tuned to different values in a number of different ways. For example, the first filter (and accordingly the second filter) may be tuned or modified to alter the first frequency band [$\omega_{f1}$, $\omega_{f2}$] (and accordingly the second frequency band [$\omega_{p1}$, $\omega_{p2}$]) defined thereby. As another example, the Fourier transforms $\hat{f}(\omega)$ and $\widehat{\Delta P}(\omega)$ of equation (3) may simply be evaluated at different variation frequencies ω. As another example, altering the variation frequency ω may comprise controlling the change in provision and/or consumption of electric power to the grid to comprise different frequency components (as described in more detail below).

Figure 4:
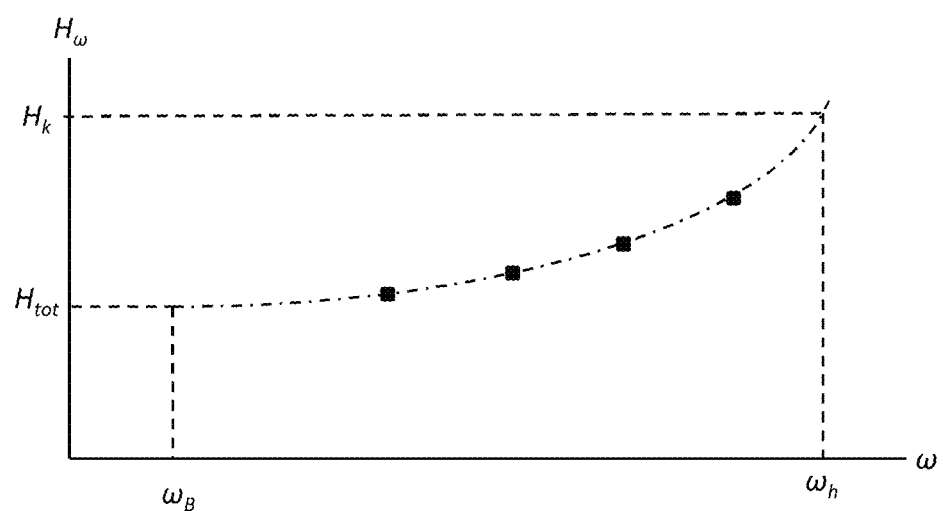
FIG. 4 illustrates schematically an exemplary plot of inertia characteristic H as a function of variation frequency co.

FIG. 4a illustrates schematically a plot of first inertia characteristic $H_\omega$ (black squares) determined for different variation frequencies ω. The plot of FIG. 4a is for first inertia characteristics Hω determined in a local area k of the grid 100 that, for example, has a higher proportion of spinning generation than does the grid 100 taken as a whole. As a result, the inertia characteristic Hω determined for high variation frequencies ω may be higher than that determined for low variation frequencies ω. A function (dot-dash line) describing the variation of $H_\omega$ as a function of ω is fitted to the determined first inertia characteristics $H_\omega$ (or to a part of the first inertia characteristic $H_\omega$), for example using a least squares fitting technique or the like. For example, the function may be of the form of a constant A plus an exponential function of variation frequency ω parameterised by constants c and C, i.e. A+C*exp(c*ω). The fitting may comprise determining values for A, C, and c that minimises the difference between the fitting function and the determined first inertia characteristics $H_\omega$. The fitted function may then be used to extrapolate the inertia characteristic $H_\omega$ at a low variation frequency, for example at the system band frequency $\omega_B$ of the electric power grid 100, which may be representative of the total inertia characteristic $H_{tot}$ associated with the total synchronous area of the electric power grid 100. Alternatively or additionally, the fitted function may be used to extrapolate the inertia characteristic $H_\omega$ at high variation frequency $\omega_h$, which may be representative of the local inertia characteristic $H_k$ associated with the local area k in which the grid frequency f was measured, for example.

In some cases, the grid frequency signal at a particular location k resulting from a given power balance change is not purely dependant on neither the inertia of the local area of the grid nor total inertia of the grid, but also on other influences. In these cases, the inertia characteristic H determined in equations (1) to (3) above for example, is not purely indicative of (dependant on) grid inertia, but can be dependent on other influences as well. For example, apart from grid inertia, the inertia characteristic H may be dependent on the flow of power between the local area k and one or more neighbouring areas (represented by a transmission term T), as well as the response of active systems in the local area k of the grid 100 to the change in grid frequency f, for example active systems that may automatically switch off if the grid frequency drops below a certain value, (represented by response term R), and background power from other unidentified sources which acts as noise (represented by noise term N). Each of these terms may contribute to the balance in provision of electric power to and consumption of electric power from the electric power grid, and hence each may contribute to the power balance change causing the variation in grid frequency f. These other contributions may be taken into account explicitly in a modified swing equation:

$$\frac{2H}{f_0} \cdot \frac{df}{dt} = \Delta P - R + T + N \quad (4)$$

The noise term N is in some cases relatively small as compared to the power balance change. Alternatively, or additionally, since the noise term N is generally comprises high and/or low frequency components, the noise term becomes small when the grid frequency variation, response term, transmission term and power balance change are determined on frequency bands not including high and/or low frequency components, as described above.

The response term R becomes small when considering relatively short time periods after the initial power balance change, in which time frame active response systems have not had enough time to react. Alternatively or additionally, the response term R becomes small when considering relatively small power balance changes which result in relatively small changes in grid frequency which are hence not detected by active response systems. The use of small power balance changes may increase the relative contribution of the noise term N, however, this can be mitigated for example, by repeating the power balance change a number of times and averaging over the resulting inertia characteristics (because of the random nature of noise).

The transmission term T becomes small at low variation frequencies as the power transfer effect on the rate of change of grid frequency is relatively small at low frequencies as compared to the effect of grid inertia. However, at relatively high variation frequencies, the transmission term is not necessarily small, and hence the inertia characteristic H determined for relatively high variation frequency bands is representative of both the grid inertia and the transmission term T.

It may be useful to have a measure of inertia, for example the inertia in a local area of the grid, that does not include the transmission term T (nor the response term R, and nor the noise term N). As mentioned above, the contribution of the noise term N may be removed by determining the grid frequency variation, response term, transmission term and power balance change on frequency bands not including high and/or low frequency components, as described above. The inventors have also appreciated that the inertia characteristic H (for example that of equation (2) above) may be described as a function of variation frequency ω that includes the transmission term $T_k$ (and response term $R_k$ if desired) and which is parameterised by a local inertia parameter $j_k$ representative of the local inertia of the area k. A plurality of first inertia characteristics $H_\omega$ for each of a respective different variation frequency ω may be determined, for example, as described above. The function may then be fitted, for example using non-linear least squares fitting or the like, to the determined first inertia characteristics $H_\omega$, and the local inertia parameter $j_k$ (which is representative of the local inertia of the area k and is not dependent on the transmission term T) may be accordingly derived. The transmission term $T_k$ may, for example, be parameterised by one or more power flow parameters representative of the flow of power between the local area k and one or more neighbouring areas of the synchronous area of the electric power grid. Such power flow parameters may also be derived by fitting the function to the plurality of first inertia characteristics $H_\omega$, thereby to also derive information about the flow of power between the local area k and one or more neighbouring areas. An example function for the first inertia characteristic $H_\omega$ is given in equation (5) below. An example functional form for $T_k$ is given below in equation (10).

$$H_\omega := \frac{\Delta P}{\frac{df}{dt}} \cdot \frac{f_0}{2} = -\frac{T_k - R_k}{\frac{df}{dt}} \cdot \frac{f_0}{2} + j_k \quad (5)$$

In other examples, one or more of the response term R, the transmission term T and the noise term N may be known. For example, data describing the response term R and/or the transmission term T may be provided from data stores or transmission network operators. For example, a transmission system operator may provide power flow data required to determine the transmission term T and/or a power plant operator may provide the data required to determine the response term R. The transmission term T may also be derived from known transmission line properties, as described in more detail below. If any one of the response term R, the transmission term T and the noise term N are known, they may be taken into account directly into the swing equation (1), which becomes:

$$H = \frac{(\Delta P - R + T + N) \cdot f_0}{2 \cdot \frac{\partial f}{\partial t}} \quad (6)$$

Since the terms R, T, and N are separated out from the inertia characteristic H in equation (6), the inertia characteristic H in equation (6) is not dependent on these terms, and hence it is an inertia parameter that more accurately represents the inertia of the grid. Equation (6) becomes linear for relatively small power balance changes, and can optionally be solved by taking the Fourier transform in variation frequency ω space (in a similar manner as described above for equation (3)), which returns:

$$H = \frac{(\hat{\Delta P}(\omega) - \hat{R}(\omega) + \hat{T}(\omega) + \hat{N}(\omega)) \cdot f_0}{2 \cdot i\omega \hat{f}(\omega)} \quad (7)$$

In equation (7) R, T and N are functions of the variation frequency ω. The value of $\hat{f}(\omega)$ and $\hat{\Delta P}(\omega)$ may be determined as described above for different variation frequencies and used in equation (7). In some examples, for example for relatively small power balance changes and hence relatively small changes in grid frequency, the response function R may be omitted. It is also noted that the noise term N may be neglected by removing noise from the grid frequency signal, the response term R and the transmission term T, for example using the filtering as described above, or by averaging over a number of measurements, for example. This method may be performed, for example, for a plurality of different locations k of the electric power grid, as described above.

It is noted that if a low power modulation frequency is used, the transmission term T becomes small, and the grid frequency variation is independent of measurement location. In this case, the inertia parameter H corresponds to the total inertia of the grid.

Figure 5:
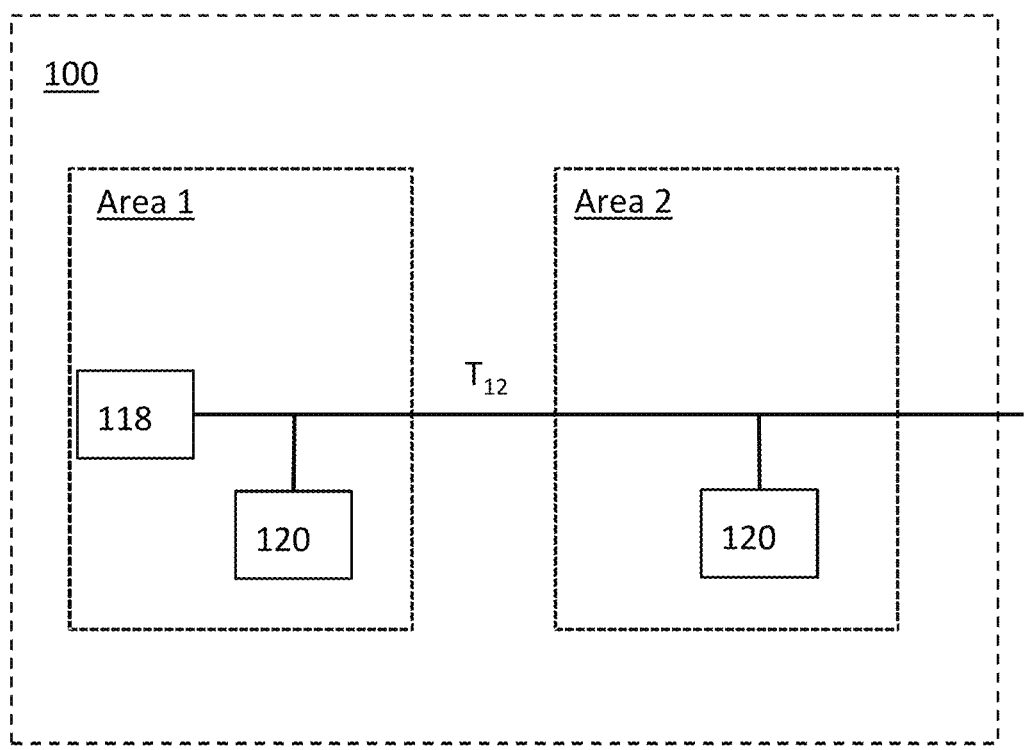
FIG. 5 illustrates schematically a diagram of example local areas of an electric power grid.

In some examples, the transmission term T or the response term R may not be known. However, the inventors have further appreciated that these may be determined in conjunction with local inertia. An illustrative example of the determination of a local inertia parameter $H_k$ representative of an inertia of a local area k of a synchronous area of an electric power grid 100 will now be described with reference to FIG. 5. FIG. 5 illustrates two local areas k=1 and 2, of and electric power grid 100. Each area comprises a measurement device 120 to measure a value of grid frequency $f_1$, $f_2$ in the respective local areas 1 and 2. Local area 1 comprises a modulation device 118 for modulating power consumed from and/or provided to the electric power grid 100. Local area 1 and local area 2 are connected by a transmission line $T_{12}$ for transmitting power between area 1 and area 2. In this example, area 1 is only connected to area 2, whereas area 2 has multiple connections to further areas (not shown). Each area k has an associated local inertia parameter $H_k$ representative of the inertia of the local area k of the power grid 100, and an associated response term $R_k$ representative of the local area's response to a power balance change to try and restore the grid frequency $f_k$ to the nominal value.

In general the grid frequency $f_k$ in a local area k is given by the extended swing equation:

$$\frac{2H_k}{f_0} \cdot \frac{df_k}{dt} = \Delta P_k - R_k + \sum_{j \neq k} T_{kj} \quad (8)$$

where $H_k$ is the local inertia, $\Delta P_k$ is the original power balance change in area k, $R_k$ is the grid's response to the original power imbalance in trying to restore nominal frequency $f_0$, and $T_{kj}$ is the power flow from local area j to local area k. The sum over the transmission term is over all neighbouring areas j to which area k is directly connected through the electric grid. It is noted that the noise term N may be neglected (as it is in equation (8) for example by removing noise from the determined grid frequency signal, for example by filtering the signal as described above.

In the example illustrated in FIG. 5, local area 1 is only connected to local area 2, and hence the measured grid frequency $f_1$ in area 1 is given by:

$$\frac{2H_1}{f_0} \cdot \frac{df_1}{dt} = \Delta P_1 - R_1 + T_{12} \quad (9)$$

where $H_1$ is the local inertia parameter of area 1, $\Delta P_1$ is the power balance change in area 1, $R_1$ is the grid response in area 1, and $T_{12}$ is the power flow from area 2 to area 1.

As mentioned above, for small changes in power balance and hence small changes in grid frequency $f_1$, the grid response term can be neglected ($R_1 \approx 0$). Hence the right-hand side of equation (7) now only includes the power balance change, $\Delta P_1$ and the transmission term $T_{12}$.

An approximation for modelling the power flow between areas 1 and 2 is a single-phase Resistance Inductance line (RL line). In this case, and in general, the power flow (transmission) term $T_{12}$ is a nonlinear function of phase angle between the areas 1 and 2. However, the function can be linearized around zero degrees of phase angle (or at another point), for example, using a Taylor expansion in phase angle. The phase angle is also by definition the time integral of the difference of frequencies of areas 1 and 2. In this case, the transmission term $T_{12}$ can be written as:

$$T_{12} \approx \frac{U^2 \cdot 2\pi f_0 L}{R^2 + 4\pi^2 f_0^2 L^2} \cdot \int f_2 - f_1 \, dt = T'_{12} \cdot \int f_2 - f_1 \, dt \quad (10)$$

where U is the voltage of the transmission line, R is the series resistance of the transmission line and L is the series inductance of the line.

Substituting the expression for the transmission term $T_{12}$ of equation (10) into the extended swing equation of equation (9) returns:

$$\frac{2H_1}{f_0} \cdot \frac{df_1}{dt} = \Delta P_1 + T'_{12} \cdot \int f_2 - f_1 \, dt \quad (11)$$

Equation (11) can be solved for $f_1$ directly or in the variation frequency domain ω by taking the Fourier transform of both sides:

$$\frac{2H_1}{f_0} \cdot i\omega \hat{f}_1 = \Delta \hat{P}_1 + T'_{12} \cdot \frac{\hat{f}_2 - \hat{f}_1}{i\omega} \quad (12)$$

which after rearrangement becomes:

$$\hat{f}_1 = \frac{\Delta \hat{P}_1 + \hat{f}_2 \frac{T'_{12}}{i\omega}}{i\omega \frac{2H_1}{f_0} + \frac{T'_{12}}{i\omega}}. \quad (13)$$

If the properties of the transmission line connecting areas 1 and 2 are known (i.e. $T'_{12}$ is known), then the inertia parameter $H_1$ in area 1 can be determined by determining (for example by measuring) the power balance change $\Delta P_1$ in local area 1 and the grid frequencies $f_1$ and $f_2$ in local areas 1 and 2 respectively, and solving equation (13 or 11) for the inertia parameter $H_1$ in area 1 by substituting the known values to equation (13 or 11).

However, in some examples, the properties of the transmission line connecting areas 1 and 2 may not be known (i.e. $T'_{12}$ is not known). In this case, the power balance change $\Delta P_1$ in local area 1 and the grid frequencies $f_1$ and $f_2$ in local areas 1 and 2 respectively are determined, as above. Equation (13 or 11) can then be fitted to the determined grid frequency $f_1$ at area 1 by finding the inertia parameter $H_1$ and the transmission parameter $T'_{12}$ values that minimise the difference between the grid frequency $f_1$ at area 1 given (predicted) by equation (13 or 11) and the determined (e.g. measured) grid frequency $f_1$ at area 1. This fitting can be done in the frequency domain, for example using equation (13), or in the time domain, for example using equation (11).

A local inertia parameter $H_1$ accurately representative of the inertia of a local area of a synchronous area of an electric power grid can therefore be determined.

It will be appreciated that the above example described with reference to FIG. 5 is an illustrative example, and the above method can also be applied to other arrangements. For example, the power balance change need not necessarily be in local area 1, nor local area 2, and may be elsewhere in the electric power grid. It will also be appreciated that more complicated situations may have more connections between local areas, which may be accounted for, for example, in the sum over transmission terms $T_{jk}$ in equation (8). The approximation that the transmission line is a RL line need not necessarily be made, and in other examples, the transmission line model can be more realistic such as a distributed parameter transmission line. It will be appreciated that in some examples the response term R need not necessarily be set to zero, and instead the response term $R_k$ may be included, for example, in equations (11) to (13). For example, the response term $R_k$ may take the form $R_k = \beta(f_k - t_0)$, where $f_0$ is the nominal grid frequency, $f_k$ is the determined grid frequency in local area k, and β is a response term parameter that can varied in order to perform the fitting as described above with respect to equations (11) and (13), for example.

It will be appreciated that the above is one example. In other examples, instead of using the time integral of the difference of frequencies of areas 1 and 2 in place of the phase angle (as in equation 10), the phase angles of area 1 and area 2 may be determined directly, for example from known or recorded phase angle data.

In some examples, the methods of determining an inertia characteristic H, for example as described above, may comprise controlling a provision of electric power to and/or a consumption of electric power from the grid, to generate the power balance variation. This may be useful as it provides control over the time, location, extent, and variation frequency characteristics of the power balance change, hence more flexibility in determining the inertia characteristic H. For example, the provision of electric power to and/or consumption of electric power from the grid may be controlled such that the power balance variation is relatively small, such that the response term R mentioned above may be small. This may be of use in reducing the contribution of this term to the inertia characteristic. As another example, the power provision/consumption may be controlled such that the power balance variation is periodic, or a repeating function. This may allow the inertia characteristic to be determined over multiple power change events, and hence to reduce the contribution of the noise term N to the inertia characteristic, even when relatively small power balance change is used. Periodic power balance variations are especially well suited to determination of inertia characteristic using Fourier transforms as described above, as in this case the components of the grid frequency and power balance variation may exist at discrete variation frequencies.

The control may be achieved, for example, by controlling one or more power modulation devices 118 (see FIG. 1) for modulating provision and/or consumption of electric power to and/or from the electric power grid 100. Each modulation device 118 may be associated with a power unit 119 (which may consume power from and/or provide power to the electric power grid 100) or a group of power units 119 and is arranged to modulate power flow to and/or from the power unit 119 or group of power units 119. Although the individual contribution of the power units 119 or group of power units 119 to grid 100 may be small, by controlling many of such power units to act simultaneously, a relatively large power balance variation may be effected.

Figure 6:
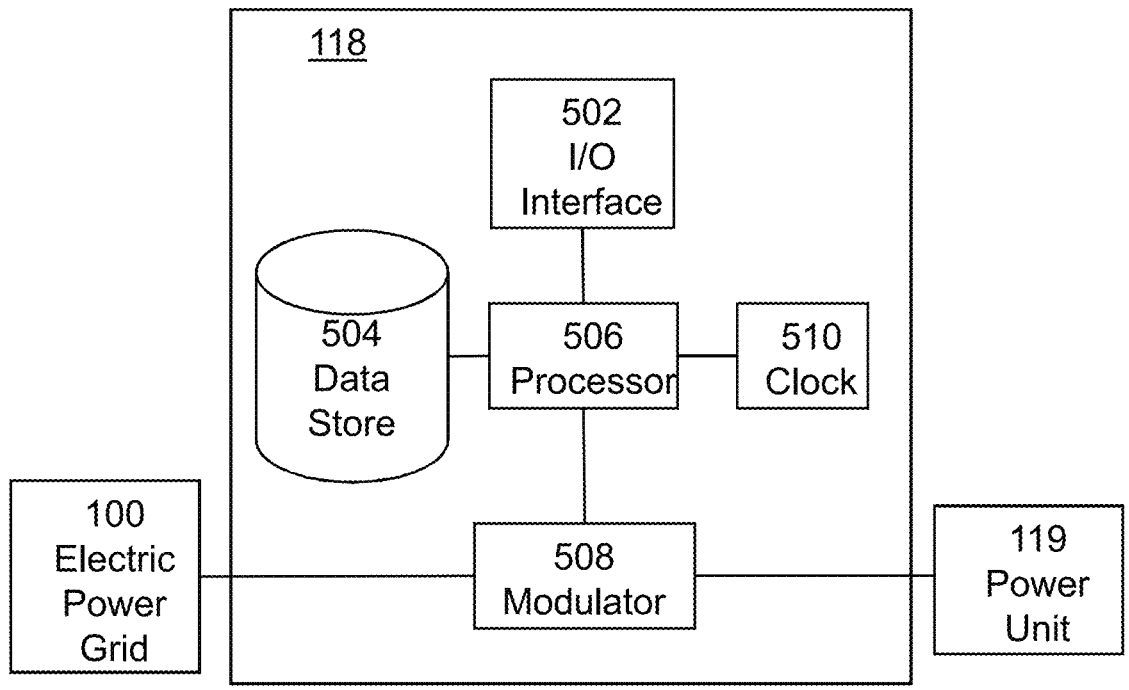
FIG. 6 illustrates schematically an exemplary arrangement of a modulation device.

FIG. 6 illustrates schematically an exemplary arrangement of a frequency modulation device 118. The frequency modulation device 118 forms an interface between the electric power grid 100 and one or more power units 119 and operates with the one or more power units 119 to control power provided to and/or consumed from the grid. The frequency modulation device 118 comprises an input/output (I/O) interface 502, a data store 504, a processor 506, a modulator 508, and a clock 510.

The frequency modulation device 118 is arranged to receive control information from a controller via the I/O interface 502. The controller may be, for example, the apparatus 600 described with reference to FIG. 7 below. The I/O interface 502 is arranged to receive information via a fixed or wireless communications network.

Control information received via the I/O interface 502 may be stored in the data store 504. For example, control information may include information of the time, location, extent, and/or functional form of the power provision/consumption variation to be provided by the power unit 119 to the grid 100.

The processor 506 is arranged to retrieve control information from the data store 504 and to generate control signals for controlling the modulator 508. The clock 510 may be synchronised with the clocks of other frequency modulation devices 118 so that they may act at the same time, if required. Synchronisation of the clock 510 may be performed on the basis of a synchronisation signal received via the (I/O) interface 506, or by any other means.

The modulator 508 is arranged to modulate power flow to/from a power unit 119 in response to the control signals generated by the processor 206. The modulator 208 may comprise any electrical or electronic means allowing power flow to/from the power unit 119 to be modulated. The modulator 208 may be an attenuator or some other means for altering the power consumption/provision by the power unit 119 (for example, inverter-based chargers for electric vehicles and/or other electric devices, grid-tie inverters for photovoltaic generators, Combined Heat and Power (CHP) generators, grid batteries, or wind generators.

In some examples, the method may comprise controlling the provision of electric power to and/or consumption of electric power from the grid such that the generated second variation comprises substantially only one variation frequency $\omega_g$. For example, one or more modulation devices 118 may be controlled to modulate the power provided to and/or consumed from the electric power grid to be an oscillatory function (for example a sine or a cosine) that has substantially one frequency $\omega_g$. In this case the power balance change $\Delta P[\omega_{p1}, \omega_{p2}]$ for example used in equation (2) may be the power balance change at that generated frequency $\Delta P[\omega_g]$, which in this case is substantially the same as the power balance change $\Delta P$. The grid frequency variation f used, for example in equation (2) may accordingly be the grid frequency variation at that generated frequency $f[\omega_g]$. This may be determined, for example, by applying a filter to the grid frequency signal to attenuate variation frequencies that are not this frequency. An inertia characteristic H may then be determined using these values in equation (2), for example. This may be useful as in this case the power balance variation need not necessarily be filtered to determine the power balance change on a certain frequency band, as the power balance change has instead been controlled to comprise substantially only one variation frequency. A plurality of first inertia characteristics $H_\omega$ may be determined for each of a respective plurality of different generated power balance variation frequency $\omega_g$, for example to determine a total inertia characteristic $H_{tot}$, local inertia characteristic $H_k$, and/or local inertia parameter $j_k$ in a manner as described above.

In some examples, the method may comprise controlling the provision of electric power to and/or consumption of electric power from the grid in a plurality of local areas of the synchronous area of the electric power grid 100. For example, a local inertia characteristic $H_k$ may be determined by controlling provision/consumption of electric power in a local area k of the grid 100. This may be repeated for different local areas k. The local inertia characteristics $H_k$ may then be mapped to the local areas k in which power provision/consumption was controlled to occur. This may be useful as it allows local inertia characteristics $H_k$ to be determined even if the grid frequency f is measured in a single location. Moreover, this may be useful as the frequency signal is strongest near the location where provision/consumption of power is controlled. The provision of electric power to and/or consumption of electric power from the grid in each of the plurality of local areas k may be controlled to be at a different time and/or at a different variation frequency to that of each other of the plurality of local areas. This allows the influence on the measured grid frequency f of the power balance variation in each of the local areas to be separated, and hence accurate local inertia characteristics $H_k$ determined.

In another example, the power provision/consumption may be controlled to occur simultaneously in different local areas k. This allows the power balance variation to be more evenly distributed throughout the grid 100, which may allow a more accurate determination of the total grid inertia characteristic $H_{tot}$. For example, the controlled power balance variation for each location k may be tailored based on the geographic distribution of inertia and power transmission properties in order to achieve the same grid frequency variation in across the grid.

Figure 7:
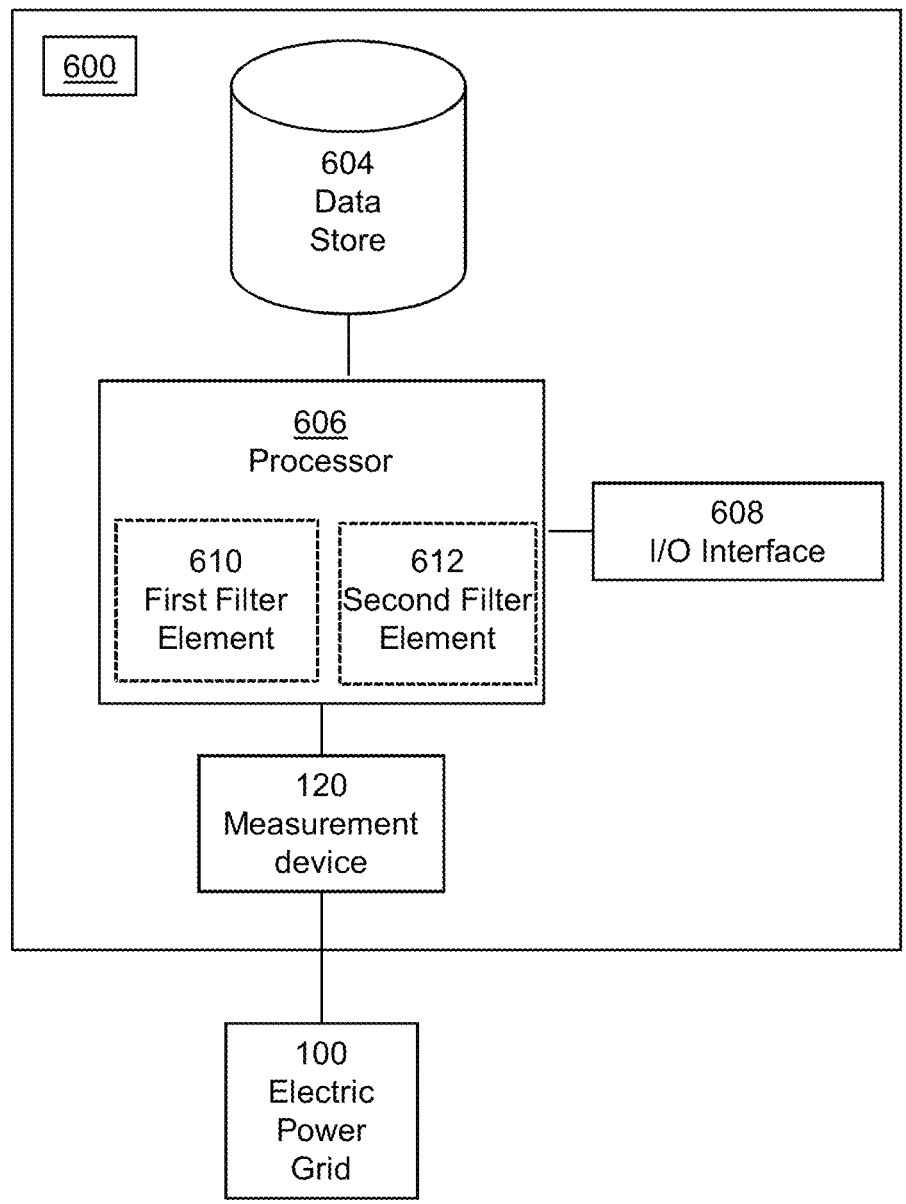
FIG. 7 illustrates schematically an exemplary arrangement of an apparatus for determining an inertia characteristic.

FIG. 7 illustrates schematically an exemplary apparatus 600 for implementing the above described methods. The apparatus 600 comprises the measurement device 120, a data store 604, a processor 606, and an input-output (I/O) interface 608.

The measurement device 120 is connected to the electric power grid 100. The measurement device 120 may be any device capable of measuring grid frequency f with sufficient precision. For example, a measurement of the half-cycle, which is the period between times at which the voltage crosses 0V, may be used to infer grid frequency. As another example, the instantaneous grid frequency, corresponding to the inverse of the time it takes to complete a half-cycle (or a full-cycle) may be determined.

The I/O interface is arranged to send and/or receive information, for example to send information stored in the data store 604, or to receive information and store it in the data store 604. This information may be, for example, control information for controlling one or more of the modulation devices 118. The information may be, for example, first data and/or second data, which may be received by the apparatus from third parties.

The data store 604 may store data, for example the first data, the second data, data indicative of grid frequency variation over a period of time, and/or data indicative of power balance variation over a period of time. The data store may store information received from the I/O interface 608. The data store 604 may store a computer program, which, when executed by the processor 606, causes the apparatus 600 to perform the above described method.

The processor 606 may be any processor capable of determining the first data and second data, and determining an inertia characteristic H based on these, as described above. For example, the processor 606 may be configured to access the data store 604 to retrieve the first data and/or the second data, and to determine an inertia characteristic based thereon. Alternatively, the processor 606 may determine the first data and/or the second data based on direct measurements of the grid frequency signal and/or the power balance change. The processor may be configured to implement operations such as filtering, or Fourier transforms, in a manner as described above, The apparatus 600 may comprise a first filter element 610 arranged to apply, to the grid frequency signal, the first filter defining the first frequency band. The apparatus 600 may also comprise a second filter element 612 arranged to apply, to the power balance change, a second filter defining the second frequency band to at least attenuate frequencies outside of the second frequency band. Although in FIG. 6 the first filter and the second filter as illustrated as being part of the processor 606, as described above, the filters may be digital or analogue, and hence the filter elements 610, 612 may accordingly be implemented by the processor 606, or may be implemented by a Resistor-Capacitor (RC) circuit (not shown) or the like which the apparatus 600 may comprise, as appropriate. Further, as described above, the measurement device 120 may, due to its limited sampling rate, itself act as the first filter 610 defining the first frequency band. As described above, the filter elements 610, 612 may comprise a plurality of filters, each of the plurality of filters defining a respective band to at least attenuate frequencies outside of the respective band.

Although in the above, the apparatus 600 was described as comprising a processor 606, this need not necessarily be the case, and in other examples, the apparatus 600 may be a purely analogue apparatus. For example, the first data and the second data may be analogue signals input into an analogue electronic circuit (not shown) and the analogue electronic circuit may output an analogue signal that represents a value of an inertia characteristic H.

The above examples are to be understood as illustrative examples of the invention. It is to be understood that any feature described in relation to any one example may be used alone, or in combination with other features described, and may also be used in combination with one or more features of any other of the examples, or any combination of any other of the examples. Furthermore, equivalents and modifications not described above may also be employed without departing from the scope of the invention, which is defined in the accompanying claims.

What is claimed is:

1. Apparatus for determining an inertia characteristic of a synchronous area of an electric power grid, electricity flowing in the grid in accordance with a grid frequency, wherein the apparatus is arranged to:
   determine first data representing a signal comprising a first variation, the first variation being a variation in the grid frequency over a period of time, the signal resulting from a second variation, the second variation being a variation in provision of electric power to and/or consumption of electric power from the grid, the signal having been filtered according to a first filter defining a first frequency band to at least attenuate frequencies outside of the first frequency band;
   determine second data representative of the second variation on a second frequency band, the second frequency band being substantially the same as the first frequency band; and
   determine an inertia characteristic of a synchronous area of the electric power grid based on the first data and the second data,
   wherein one of the first frequency band and the second frequency band is set on the basis of the other of the first frequency band and the second frequency band.

2. The apparatus according to claim 1, wherein the apparatus comprises a measurement device arranged to:
   measure the signal comprising the first variation.

3. The apparatus according to claim 1, wherein the apparatus comprises a first filter element arranged to:
   apply, to the signal, the first filter defining the first frequency band.

4. The apparatus according to claim 3, wherein the first filter element comprises a plurality of filters, each of the plurality of filters defining a respective band to at least attenuate frequencies outside of the respective band, wherein the first filter element is representative of a combination of the plurality of filters.

5. The apparatus according to claim 1, wherein the apparatus comprises a second filter element arranged to:
   apply, to the second variation, a second filter defining the second frequency band to at least attenuate frequencies outside of the second frequency band.

6. The apparatus according to claim 5, wherein the second filter and/or the first filter comprises one or both of an analogue filter and a digital filter.

7. A computer program comprising instructions which, when executed by a computer, causes the computer at least to perform:
   determining first data representing a signal comprising a first variation, the first variation being a variation in the grid frequency over a period of time, the signal resulting from a second variation, the second variation being a variation in provision of electric power to and/or consumption of electric power from the grid, the signal having been filtered according to a first filter defining a first frequency band to at least attenuate frequencies outside of the first frequency band;
   determining second data representative of the second variation on a second frequency band, the second frequency band being substantially the same as the first frequency band; and
   determining an inertia characteristic of the electric power grid based on the first data and the second data,
   wherein one of the first frequency band and the second frequency band is set on the basis of the other of the first frequency band and the second frequency band.

8. A method of determining an inertia characteristic of a synchronous area of an electric power grid, electricity flowing in the grid in accordance with a grid frequency, the method comprising:
   determining first data representing a signal comprising a first variation, the first variation being a variation in the grid frequency over a period of time, the signal resulting from a second variation, the second variation being a variation in provision of electric power to and/or consumption of electric power from the grid, the signal having been filtered according to a first filter defining a first frequency band to at least attenuate frequencies outside of the first frequency band;
   determining second data representative of the second variation on a second frequency band, the second frequency band being substantially the same as the first frequency band; and
   determining an inertia characteristic of the electric power grid based on the first data and the second data,
   wherein one of the first frequency band and the second frequency band is set on the basis of the other of the first frequency band and the second frequency band.

9. The method according to claim 8, the method comprising:
   transforming one or both of the first variation and the second variation into a frequency domain.

10. The method according to claim 8, the method comprising:
    determining a plurality of first inertia characteristics for each of a respective different variation frequency.

11. The method according to claim 10, the method comprising:
    fitting a function to the plurality of first inertia characteristics, the function being parameterised at least by a local inertia parameter, thereby to derive the local inertia parameter, wherein the local inertia parameter is representative of an inertia of a local area of the synchronous area of the electric power grid.

12. The method according to claim 11, wherein the function is parameterised at least by one or more power flow parameters representative of the flow of power between the local area and one or more neighbouring areas of the synchronous area of the electric power grid.

13. The method according to claim 10, the method comprising:
extrapolating, from the plurality of first inertia characteristics, a total inertia characteristic associated with the total synchronous area of the electric power grid.

14. The method according to claim 8, the method comprising:
determining the first data for a first area of the electric power grid; and
determining, based on the first data for the first area of the electric power grid, and the second data, a local inertia value relating to the first area using a function parameterised by at least a parameter relating to power flow between the first area and a second area of the electric power grid.

15. The method according to claim 8, the method comprising:
controlling a provision of electric power to and/or a consumption of electric power from the grid, to generate the second variation.

16. The method according to claim 15, the method comprising:
controlling the provision of electric power to and/or consumption of electric power from the grid such that the generated second variation is periodic.

17. The method according to claim 15, the method comprising:
controlling the provision of electric power to and/or consumption of electric power from the grid such that the generated second variation comprises substantially only one variation frequency.

18. The method according to claim 15, the method comprising:
controlling the provision of electric power to and/or consumption of electric power from the grid in a plurality of local areas of the synchronous area of the electric power grid.

19. The method according to claim 18, the method comprising:
controlling the provision of electric power to and/or consumption of electric power from the grid in each of the plurality of local areas to be at a different time and/or at a different variation frequency to that of each other of the plurality of local areas.

20. A method of determining a local inertia parameter representative of an inertia of a local area of a synchronous area of an electric power grid, electricity flowing in the grid in accordance with a grid frequency, the method comprising:
determining first data representing a signal comprising a first variation, the first variation being a variation in the grid frequency over a period of time, the signal resulting from a second variation, the second variation being a variation in provision of electric power to and/or consumption of electric power from the grid, the signal having been filtered according to a first filter defining a first frequency band to at least attenuate frequencies outside of the first frequency band;
determining second data representative of the second variation on a second frequency band, the second frequency band being substantially the same as the first frequency band;
determining, based on the first data and on the second data, a plurality of first inertia characteristics for each of a respective different variation frequency; and
fitting a function to the plurality of first inertia characteristics, the function being parameterised at least by a local inertia parameter, thereby to derive the local inertia parameter,
wherein one of the first frequency band and the second frequency band is set on the basis of the other of the first frequency band and the second frequency band.

21. A method of determining a local inertia value representative of an inertia of a local area of a synchronous area of an electric power grid, electricity flowing in the grid in accordance with a grid frequency, the method comprising:
determining first data representing a signal in a first area of the electric power grid, the signal comprising a first variation, the first variation being a variation in the grid frequency over a period of time, the signal resulting from a second variation, the second variation being a variation in provision of electric power to and/or consumption of electric power from the grid the signal having been filtered according to a first filter defining a first frequency band to at least attenuate frequencies outside of the first frequency band;
determining second data relating to the second variation on a second frequency band, the second frequency band being substantially the same as the first frequency band;
determining, based on the first data, and the second data, a local inertia value relating to the first area using a function parameterised by at least a parameter relating to power flow between the first area and a second area of the electric power grid,
wherein one of the first frequency band and the second frequency band is set on the basis of the other of the first frequency band and the second frequency band.

* * * * *